US009543541B1

United States Patent
Baisl et al.

(10) Patent No.: US 9,543,541 B1
(45) Date of Patent: Jan. 10, 2017

(54) OPTOELECTRONIC COMPONENT AND METHOD FOR THE PRODUCTION THEREOF

(71) Applicant: OSRAM OLED GmbH, Regensburg (DE)

(72) Inventors: Richard Baisl, Regensburg (DE); Christoph Kefes, Regensburg (DE); Michael Popp, Freising (DE)

(73) Assignee: Osram OLED GmbH, Regensburg (DE)

( * ) Notice: Subject to any disclaimer, the term of this patent is extended or adjusted under 35 U.S.C. 154(b) by 0 days.

(21) Appl. No.: 14/901,743

(22) PCT Filed: Jun. 30, 2014

(86) PCT No.: PCT/EP2014/063868
§ 371 (c)(1),
(2) Date: Dec. 29, 2015

(87) PCT Pub. No.: WO2015/000857
PCT Pub. Date: Jan. 8, 2015

(30) Foreign Application Priority Data

Jul. 2, 2013 (DE) .......... 10 2013 106 937

(51) Int. Cl.
*H01L 51/52* (2006.01)
*H01L 51/56* (2006.01)

(52) U.S. Cl.
CPC ....... *H01L 51/5243* (2013.01); *H01L 51/5253* (2013.01); *H01L 51/56* (2013.01); *H01L 2251/301* (2013.01)

(58) Field of Classification Search
CPC .. H01L 51/5243; H01L 51/56; H01L 51/5253; H01L 2251/301
See application file for complete search history.

(56) References Cited

U.S. PATENT DOCUMENTS 3,141,238 A 7/1964 Harman, Jr.
3,335,489 A 8/1967 Grant
(Continued)

FOREIGN PATENT DOCUMENTS

DE 19532251 A1 3/1997
DE 102007046730 A1 4/2009
(Continued)

OTHER PUBLICATIONS

International Search Report based on application No. PCT/EP2014/063868 (4 pages and 3 pages of English translation) dated Oct. 13, 2014 (for reference purpose only).
(Continued)

*Primary Examiner* — Mamadou Diallo
(74) *Attorney, Agent, or Firm* — Viering, Jentschura & Partner mbB

(57) ABSTRACT

A method for producing an optoelectronic component includes forming an optoelectronic layer structure including a functional layer structure above a carrier, forming a frame structure including a first metallic material on the optoelectronic layer structure such that a region above the functional layer structure is free of the frame structure and that the frame structure surrounds the region, forming an adhesion layer including a second metallic material above a covering body, applying a liquid first alloy to the optoelectronic layer structure and/or to the adhesion layer of the covering body in the region, coupling the covering body to the optoelectronic layer structure such that the adhesion layer is coupled to the frame structure and the liquid first alloy is in direct contact with the adhesion layer and the frame structure, and reacting part of the first alloy chemically with the metallic materials of the frame structure and the adhesion layer.

14 Claims, 3 Drawing Sheets

(56) References Cited

U.S. PATENT DOCUMENTS

| | | | |
|---|---|---|---|
| 5,043,139 A | 8/1991 | Carnall, Jr. et al. | |
| 5,053,195 A | 10/1991 | MacKay | |
| 5,653,856 A | 8/1997 | Ivanov et al. | |
| 6,665,186 B1 | 12/2003 | Calmidi et al. | |
| 2002/0068143 A1* | 6/2002 | Silvernail | B32B 3/00 428/76 |
| 2003/0215981 A1 | 11/2003 | Strouse et al. | |
| 2014/0226285 A1 | 8/2014 | Bauer et al. | |
| 2014/0246665 A1 | 9/2014 | Lang et al. | |

FOREIGN PATENT DOCUMENTS

| | | |
|---|---|---|
| DE | 102011112476 A1 | 3/2013 |
| DE | 102011084276 A1 | 4/2013 |
| GB | 2419465 A | 4/2006 |

OTHER PUBLICATIONS

German Search Report based on application No. 10 2013 106 937.1(7 pages) dated Jun. 13, 2014 (for reference purpose only).

\* cited by examiner

OPTOELECTRONIC COMPONENT AND METHOD FOR THE PRODUCTION THEREOF

RELATED APPLICATIONS

The present application is a national stage entry according to 35 U.S.C. §371 of PCT application No. PCT/EP2014/063868 filed on Jun. 30, 2014 which claims priority from German application No. 10 2013 106 937.1 filed on Jul. 2, 2013, and is incorporated herein by reference in its entirety.

TECHNICAL FIELD

Various embodiments relate to a method for producing an optoelectronic component, and to an optoelectronic component.

BACKGROUND

In a conventional optoelectronic component, adhesion media, for example adhesives, solders, encapsulation layers, metal seals and/or covering bodies, such as glass bodies, for example, are used for connecting and/or sealing component parts of the optoelectronic component. Applying these auxiliary media to the component parts of the optoelectronic component that are to be connected and/or sealed can often be relatively time-consuming, cost-intensive and/or imprecise. Upon drying and/or upon loading caused by thermal cycling of adhesion media and/or encapsulation layers, cracks or holes can occur in the corresponding layers. Furthermore, during the production of the corresponding optoelectronic components, particles can get into the layers or between the layers. These cracks, holes and/or particles can have the effect that the corresponding optoelectronic component functions only to a restricted extent or no longer functions at all.

Particularly in the case of optoelectronic surface light sources such as OLEDs, for example, the hermetic shielding of organic functional layer structures is important in order to ensure for example the storage stability, for example 10 years, and/or the lifetime in operation, for example over 10 000 hours. For example, permeability values for moisture and/or oxygen of less than $10^{-6}$ g/cm/d can be required here. Known media for sealing and/or encapsulating the optoelectronic components are very sensitive with regard to particle loading, inter alia, and known processes can even reduce the lifetime, in favor of longer storage times. Therefore, in known methods, TFE thin-film encapsulations are produced under a very clean atmosphere with the most minimal particle loading, for example in a TFE process without a shadow mask. The TFE encapsulation can be for example a CVD, ALD, PECUP layer or some other layer. As an alternative thereto, other encapsulation methods are also employed, for example cavity encapsulation and glass solder encapsulation.

SUMMARY

In various embodiments, a method for producing an optoelectronic component is provided which makes it possible to produce the optoelectronic component simply, expediently and/or precisely, and/or to encapsulate and/or seal component parts of the optoelectronic component simply, cost-effectively and/or precisely.

In various embodiments, an optoelectronic component is provided which is producible simply, expediently and/or precisely and/or whose component parts are encapsulated and/or sealed simply, cost-effectively and/or precisely.

In various embodiments, a method for producing an optoelectronic component is provided, wherein an optoelectronic layer structure including a functional layer structure is formed above a carrier. A frame structure including a first metallic material is formed on the optoelectronic layer structure in such a way that a region above the functional layer structure is free of the frame structure and that the frame structure surrounds the region. An adhesion layer including a second metallic material is formed above a covering body. A liquid first alloy is applied to the first optoelectronic layer structure and/or to the adhesion layer of the covering body in the region. The covering body is coupled to the optoelectronic layer structure in such a way that the adhesion layer is coupled to the frame structure and the liquid first alloy is in direct physical contact with the adhesion layer and the frame structure. At least part of the first alloy reacts, for example chemically, with the metallic materials of the frame structure and the adhesion layer, as a result of which at least one second alloy is formed which solidifies and thus fixedly connects the covering body to the optoelectronic layer structure.

Arranging the liquid first alloy in the region above the functional layer structure makes it possible to produce the optoelectronic component simply, expediently and/or precisely, and to encapsulate and/or seal the component parts of the optoelectronic component, in particular the covering body and the optoelectronic layer structure, simply, cost-effectively and/or precisely. The first alloy has a melting point that is lower than the melting point of the second alloy. The low melting point of the first alloy is for example below a temperature starting from which materials of the functional layer structure, for example of organic layers, are damaged. This enables particularly gentle production of the optoelectronic component, as a result of which in turn the lifetime and the storage stability can be increased.

The use of the first alloy having a low melting point in interaction with the second or further alloys makes it possible for a metallic sealing layer to be produced from the first and second alloys. In this case, the melting point of the first alloy can be chosen such that the first alloy is liquid under all operating and storage conditions, and the melting point of the second alloy can be chosen such that the second alloy is solid under all operating and storage conditions. The adhesion layer may include a liquid starting alloy including the second metallic material.

The coupling of the covering body to the optoelectronic layer structure with the aid of the liquid first alloy takes place at a temperature at which the first alloy is liquid and the second alloy is not liquid. Upon contact with the metallic materials of the frame structure and the adhesion layer, the second alloy forms from the metals of the first alloy and the metallic materials of the frame structure and the adhesion layer. On account of the currently prevailing temperature, said second alloy undergoes transition to its solid state of matter and solidifies. In this case the covering body and the optoelectronic layer structure are connected to one another. If this process takes place closely and completely around the region above the functional layer structure, in particular along the frame structure, then this region is sealed relative to surroundings, for example in a liquid-tight and/or gas-tight manner.

If the first alloy is applied to the optoelectronic layer structure at a location at which the optoelectronic layer structure has a defect, for example a crack, a hole or a particle, then the first alloy can flow into the crack or the hole and close it or the particle can be embedded in the liquid first alloy. This can contribute to the fact that the optoelectronic component can be operated over a long lifetime and/or can be stored over a long storage time, without the functionality of the optoelectronic component being significantly reduced.

The first alloy, the frame structure and the adhesion layer can be formed in such a way that the first alloy remains liquid at least in parts of the region above the functional layer structure, even after the completion of the optoelectronic component. If a defect then forms subsequently, even in the completed component the first alloy can flow into the defect and close the latter.

If one of the above mentioned defects extends as far as a layer of the functional layer structure which includes a metallic material that reacts with the first alloy, then the second or a further alloy can form, which then solidifies and fixedly closes the corresponding defect.

The first alloy can be applied for example directly on an encapsulation layer, for example a TFE layer, or on an electrode layer, for example a cathode, of the optoelectronic component. If contact with the metallic material, for example the cathode layer, occurs, then the alloying of the second alloy commences, which closes the defect. The liquid first alloy can thus make it possible for the optoelectronic component to have a kind of self-healing mechanism. The lifetime, a robustness and the storage stability can be improved as a result.

The fact that the first alloy is liquid means that the first alloy is present in a liquid state of matter. This is in contrast to a situation in which although alloy particles are present in a solid state, they are embodied in a liquid or viscous carrier material such as, for example, solder balls in a solder paste. The fact that at least one second or one further alloy is formed means that the liquid first alloy together with the first, second or further metallic material forms the second or the further alloy, wherein the metallic materials can be identical or different among one another. If the first and second metallic materials are identical, for example, then exactly one second alloy is formed. If the first and second metallic materials are different, then the second alloy and a further alloy, for example a third alloy, can be formed.

The adhesion layer can be formed integrally with the covering body. In other words, the second adhesion layer can be formed by the material of the covering body. By way of example, the covering body may include a metal-containing glass including the second metallic material. As an alternative thereto, the adhesion layer can be formed on the covering body. By way of example, the covering body can be coated with the adhesion layer. The first and/or second metallic material can be for example a metal or a semimetal. The covering body may include and/or be formed from glass or metal, for example.

The adhesion layer, the frame structure and/or, if appropriate, further layers, for example an encapsulation layer, can be formed for example by vacuum evaporation, printing, spraying, laser structuring or by means of blade coating. Furthermore, the adhesion layer and/or the frame structure can be present as an alloy, for example as adhesion or starting alloy, which can initially be liquid or viscous, for example.

The method explained above increases the storage stability by virtue of the fact that the first alloy can be introduced at leakage locations, for example of an encapsulation layer. Moreover, the particle resistance is increased as a result. Moreover, this method can serve to detect leakages in encapsulation layers. Furthermore, large surface regions can be wetted with the liquid first alloy, as a result of which, under certain circumstances, a better particle resistance can be obtained. Nontoxic materials can be chosen as the liquid first alloy. Furthermore, the first alloy can be chosen in such a way that it is not water-soluble, as a result of which fewer to no contamination problems occur.

In various embodiments, the melting point of the first alloy is in a range of between −20° C. and 100° C., in particular between 0° C. and 80° C., in particular between 20° C. and 30° C. This makes it possible to process the first alloy in the liquid state at a temperature which is harmless or at least substantially harmless for other component parts of the optoelectronic component, for example for an organic functional layer structure in the case of an OLED.

In various embodiments, the first alloy is liquid at room temperature. This makes it possible to produce the optoelectronic component particularly expediently and simply. In particular, with the use of the first alloy, temperature regulation of the component parts of the optoelectronic component is not necessary. In particular, processing under ambient air in a clean room is possible.

In various embodiments, the first alloy includes gallium, indium, tin, copper, molybdenum, silver and/or bismuth. By way of example, the first alloy includes GaInSn or InBiSn.

In various embodiments, the first and/or second metallic material includes aluminum, zinc, chromium, copper, molybdenum, silver, gold, nickel, gallium, indium and/or tin. By way of example, it is also possible to form a plurality of layers of the stated materials in different layer sequences. Accordingly, the second alloy or the further alloy may include for example aluminum, tin, magnesium, silver, copper, silver, gold, molybdenum or zinc.

In various embodiments, the optoelectronic layer structure includes an encapsulation layer, and the frame structure is formed on the encapsulation layer. The encapsulation layer can be a TFE thin-film encapsulation layer for example.

In various embodiments, a first anti-adhesion layer is formed laterally adjacently to the frame structure at least in sections, the material of which first anti-adhesion layer does not react chemically with the first alloy and/or which first anti-adhesion layer is not wetted by the first alloy. The first anti-adhesion layer can be used to restrict the chemical reaction between the first alloy and the metallic materials of the adhesion layer and/or the frame structure. By way of example, within the frame structure there can be a plurality of sections in which the first alloy adjoins the anti-adhesion layer. In that case no second alloy at all or only little second alloy forms in said sections.

In various embodiments, a second anti-adhesion layer is formed laterally adjacently to the adhesion layer above the covering body, the material of which second anti-adhesion layer does not react chemically with the first alloy and/or which second anti-adhesion layer is not wetted by the first alloy. The second anti-adhesion layer can be used, when the first alloy is applied to the adhesion layer, to prevent the first alloy from flowing onto the second adhesion layer and to restrict the distribution of the first alloy to a first region.

In various embodiments, an optoelectronic component is provided, for example the optoelectronic component which is produced with the aid of the method explained above. The optoelectronic component includes the carrier and the optoelectronic layer structure, which is formed above the carrier and which includes the functional layer structure. The frame structure includes the first metallic material and is formed above the optoelectronic layer structure. The region above the functional layer structure is free of the frame structure and the frame structure surrounds the region. The covering body has the adhesion layer, which includes the second metallic material and which is coupled to the frame structure. The liquid first alloy is arranged in the region on the optoelectronic layer structure. The second alloy emerges from the chemical reaction of the first alloy with the metallic materials of the frame structure and the adhesion layer, wherein the second alloy is rigid and fixedly connects the covering body to the optoelectronic layer structure.

In various embodiments, the melting point of the first alloy is in a range of between −20° C. and 100° C., in particular between 0° C. and 80° C., in particular between 20° C. and 30° C.

In various embodiments, the first alloy is liquid at room temperature.

In various embodiments, the first alloy includes gallium, indium, tin and/or bismuth.

In various embodiments, the first and/or second metallic material include(s) aluminum, zinc, chromium, copper, molybdenum, silver, gold, nickel, gallium, indium and/or tin. By way of example, it is also possible to form a plurality of layers of the stated materials in different layer sequences.

In various embodiments, the optoelectronic layer structure includes an encapsulation layer, and the frame structure is formed on the encapsulation layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
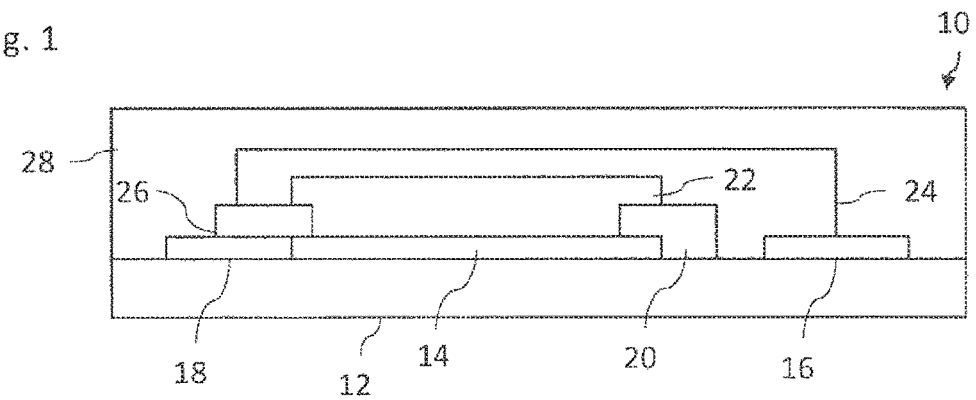
FIG. 1 shows first component parts of one exemplary embodiment of an optoelectronic component in a first state during the method for producing the optoelectronic component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component can be an electromagnetic radiation emitting component or an electromagnetic radiation absorbing component. An electromagnetic radiation absorbing component can be a solar cell, for example. An electromagnetic radiation emitting component can be for example an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this connection, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing. In various embodiments, an optoelectronic component can be designed as a top and/or bottom emitter. A top and/or bottom emitter can also be designated as optically transparent component, for example a transparent organic lighting diode.

In the case of a cohesive connection, a first body can be connected to a second body by means of atomic and/or molecular forces. Cohesive connections can often be non-releasable connections. In various configurations, a cohesive connection can be realized for example as an adhesive connection, a solder connection, for example of a glass solder or of a metal solder or as a welded connection.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion.

A metallic material may include or be a metal and/or a semimetal, for example.

FIG. 1 shows first component parts of one embodiment of an optoelectronic component 10 in a first state during a method for producing the optoelectronic component 10. The optoelectronic component 10 includes a carrier 12. The carrier 12 can be formed as a protective layer, for example. The carrier 12 can serve for example as a carrier element for electronic elements or layers, for example light emitting elements. By way of example, the carrier 12 may include or be formed from glass, quartz and/or a semiconductor material. Furthermore, the carrier 12 may include or be formed from a plastics film or a laminate including one or including a plurality of plastics films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 12 may include one or more of the materials mentioned above. The carrier 12 may include or be formed from a metal or a metal compound, for example copper, silver, gold, platinum or the like. The carrier 12 including a metal or a metal compound can also be embodied as a metal film or a metal-coated film. The carrier 12 can be embodied as translucent or transparent.

In various embodiments, a barrier layer (not illustrated) can optionally be arranged on or above the carrier 12. The barrier layer may include or consist of one or more of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An active region of the optoelectronic component 10 is arranged on or above the carrier 12 or the barrier layer. The active region can be understood as that region of the optoelectronic component 10 in which electric current for the operation of the optoelectronic component 10 flows and the electromagnetic radiation is generated or absorbed. The active region includes a first electrode layer 14, a second electrode layer 24 and a functional layer structure 22 therebetween.

The first electrode layer 14 is formed on the carrier 12 if the barrier layer is not present. The first electrode layer 14 can be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped. The first electrode layer 14 may include a metal; for example Ag, Pt, Au, Mg, Al, Ba, In, Ag, Au, Mg, Ca, Sm or Li, and compounds, combinations or alloys of these substances. The first electrode layer 14 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode layer 14 may include one or a plurality of the following materials as an alternative or in addition to the above mentioned substances: networks composed of metallic nanowires and nanoparticles, for example composed of Ag; networks composed of carbon nanotubes; graphene particles and graphene layers; networks composed of semiconducting nanowires. Furthermore, the first electrode layer 14 may include electrically conductive polymers or transition metal oxides or transparent electrically conductive oxides.

In various embodiments, the first electrode layer 14 and the carrier 12 can be formed as translucent or transparent. The first electrode layer 14 can have for example a layer thickness in a range of approximately 1 nm to approximately 500 nm, for example a layer thickness in a range of approximately 10 nm to approximately 250 nm, for example a layer thickness in a range of approximately 100 nm to approximately 150 nm.

The first electrode layer 14 can be formed as an anode, that is to say as a hole-injecting electrode, or as a cathode, that is to say as an electron-injecting electrode.

Alongside the first electrode layer 14, a first contact feed 18 is formed on the carrier 12, said first contact feed being electrically coupled to the first electrode layer 14. The first contact feed 18 can be coupled to a first electrical potential (provided by an energy source (not illustrated), for example a current source or a voltage source). Alternatively, the first electrical potential can be applied to the carrier 12 and then be applied indirectly to the first electrode layer 14 via said carrier. The first electrical potential can be for example the ground potential or some other predefined reference potential.

The functional layer structure 22, for example an organic functional layer structure, is formed above the first electrode layer 14. The functional layer structure 22 may include one or a plurality of emitter layers, for example including fluorescent and/or phosphorescent emitters, and one or a plurality of hole-conducting layers (also designated as hole transport layer(s)). In various embodiments, one or a plurality of electron-conducting layers (also designated as electron transport layer(s)) can alternatively or additionally be provided.

Examples of emitter materials which can be used in the optoelectronic component 10 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl (2-carboxypyridyl) iridium III), green phosphorescent $Ir(ppy)_3$ (tris(2-phenylpyridine) iridium III), red phosphorescent Ru $(dtb-bpy)_3*2(PF_6)$ (tris-[4,4' -di-tert-butyl-(2,2')-bipyridine]ruthenium(III) complex) and blue fluorescent DPAVBi (4,4-bis[4-(di-p-tolylamino) styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example or can be applied by means of blade coating. Furthermore, it is possible to use polymer emitters, which can be deposited, in particular, by means of a wet-chemical method such as spin coating, for example. The emitter materials can be embedded in a matrix material in a suitable manner.

The emitter materials of the emitter layer(s) can be selected for example such that the optoelectronic component 10 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The functional layer structure 22 may generally include one or a plurality of electroluminescent layers. The electroluminescent layers may include organic polymers, organic oligomers, organic monomers, organic small, non-polymeric molecules ("small molecules") or a combination of these substances. By way of example, the functional layer structure 22 may include one or a plurality of electroluminescent layers embodied as a hole transport layer, so as to enable for example in the case of an OLED an effective hole injection into an electroluminescent layer or an electroluminescent region. Alternatively, in various embodiments, the functional layer structure 22 may include one or a plurality of functional layers embodied as an electron transport layer, so as to enable for example in an OLED an effective electron injection into an electroluminescent layer or an electroluminescent region. By way of example, tertiary amines, carbazole derivatives, conductive polyaniline or polyethylene dioxythiophene can be used as material for the hole transport layer. In various embodiments, the electroluminescent layers can be embodied as an electroluminescent layer.

In various embodiments, the hole transport layer can be applied, for example deposited, on or above the first electrode layer 14, and the emitter layer can be applied, for example deposited, on or above the hole transport layer. In various embodiments, the electron transport layer can be applied, for example deposited, on or above the emitter layer.

In various embodiments, the functional layer structure 22 can have a layer thickness in a range of approximately 10 nm to approximately 3 µm, for example of approximately 100 nm to approximately 1 µm, for example of approximately 300 nm to approximately 800 µm. In various embodiments, the functional layer structure 22 can have for example a stack of layers from among those mentioned arranged one above another.

The optoelectronic component 10 may optionally generally include further functional layers, for example arranged on or above the one or the plurality of emitter layers or on or above the electron transport layer(s), which serve to further improve the functionality and thus the efficiency of the optoelectronic component 10.

The second electrode layer 24 is formed above the functional layer structure 22. Alongside the first electrode layer 14, to be precise on a side of the first electrode layer 14 facing away from the first contact feed 18, a second contact feed 16 is formed above the carrier 12. The second contact feed 16 is electrically coupled to the second electrode layer 24. The second contact feed 16 serves for electrically contacting the second electrode layer 24. A second electrical potential can be applied to the second contact feed 16. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V. The second electrode layer 24 may include or be formed from the same substances as the first electrode layer 14. The second electrode layer 24 can have for example a layer thickness in a range of approximately 1 nm to approximately 100 nm, for example of approximately 10 nm to approximately 50 nm, for example of approximately 15 nm to approximately 30 nm. The second electrode layer 24 can generally be formed in a manner similar to a configuration of the first electrode layer 14 or differently than the latter. The second electrode layer 24 can be formed as an anode, that is to say as a hole-injecting electrode, or as a cathode, that is to say as an electron-injecting electrode.

In various embodiments, the first electrode layer 14 and the second electrode layer 24 are both formed as translucent or transparent. Consequently, the optoelectronic component 10 can be formed as a top and bottom emitter and/or as a transparent optoelectronic component 10.

The electrical contact feeds 18, 16 can serve for example as parts of the anode and cathode, respectively. The electrical contact feeds 18, 16 can be formed such that they are transparent or nontransparent. The electrical contact feeds 18, 16 may include for example partial layers including for example molybdenum/aluminum/molybdenum, chromium/aluminum/chromium, silver/magnesium or exclusively aluminum. The second electrode layer 24 is separated from the first contact feed 18 and the first electrode layer 14 by a first insulator layer 20 and a second insulator layer 26. The insulator layers 20, 26 include polyimide, for example, and are formed optionally.

The carrier 12 with the first electrode layer 14, the contact feeds 16, 18 and the insulator layers 20, 26 can also be designated as a substrate. The functional layer structure 22 is formed on the substrate.

An encapsulation layer 28 is formed above the second electrode layer 24 and partly above the first contact feed 18, the second contact feed 16 and the second insulator layer 26. The encapsulation layer 28 thus covers the first contact feed 18 and the second contact feed 16 and can subsequently be at least partly exposed for electrically contacting the contact feeds 18, 16. The encapsulation layer 28 can be formed for example in the form of a barrier thin-film layer or thin-film encapsulation. In the context of this application, a "barrier thin-film layer" or a "thin-film encapsulation" can be understood to mean a layer or a layer structure which is suitable for forming a barrier against chemical impurities or atmospheric substances, in particular against water (moisture) and oxygen. In other words, the encapsulation layer 28 is formed in such a way that, for example, OLED-damaging substances such as water, oxygen or solvent cannot penetrate through it or at most very small proportions of said substances can penetrate through it.

In accordance with one configuration, the encapsulation layer 28 can be formed as an individual layer (to put it another way, as a single layer). In accordance with an alternative configuration, the encapsulation layer 28 may include a plurality of partial layers formed one on top of another. In other words, in accordance with one configuration, the encapsulation layer 28 can be formed as a layer stack. The encapsulation layer 28 or one or a plurality of partial layers of the encapsulation layer 28 can be formed for example by means of a suitable deposition method, e.g. by means of an atomic layer deposition (ALD) method, e.g. a plasma enhanced atomic layer deposition (PEALD) method or a plasmaless atomic layer deposition (PLALD) method, or by means of a chemical vapor deposition (CVD) method, e.g. a plasma enhanced chemical vapor deposition (PECVD) method or a plasmaless chemical vapor deposition (PLCVD) method. In accordance with one configuration, in the case of an encapsulation layer 28 having a plurality of partial layers, all the partial layers can be formed by means of an atomic layer deposition method. A layer sequence including only ALD layers can also be designated as a "nanolaminate". By using an atomic layer deposition (ALD) method, it is possible for very thin layers to be deposited. In particular, layers having layer thicknesses in the atomic layer range can be deposited.

In accordance with one configuration, the encapsulation layer 28 can have a layer thickness of approximately 0.1 nm (one atomic layer) to approximately 1000 nm, for example a layer thickness of approximately 10 nm to approximately 100 nm, for example approximately 40 nm.

In accordance with one configuration in which the encapsulation layer 28 includes a plurality of partial layers, all the partial layers can have the same layer thickness. In accordance with another configuration, the individual partial layers of the encapsulation layer 28 can have different layer thicknesses. In other words, at least one of the partial layers can have a different layer thickness than one or more other partial layers. The encapsulation layer 28 or the individual partial layers of the encapsulation layer 28 can be formed as a translucent or transparent layer.

In accordance with one configuration, the encapsulation layer 28 or one or a plurality of the partial layers of the encapsulation layer 28 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the encapsulation layer 28 or one or a plurality of the partial layers of the encapsulation layer 28 may include one or a plurality of high refractive index substances, to put it another way one or a plurality of substances having a high refractive index, for example having a refractive index of at least 2.

The encapsulation layer 28 can cover the underlying layers for example in a planar fashion without lateral structuring. In this application, the lateral direction denotes a direction which is parallel to the plane which is formed by the surface of the carrier 12 on which the first electrode layer 14 is formed.

In various embodiments, above the second electrode layer 24, an electrically insulating layer (not illustrated) can be applied, for example SiN, $SiO_x$, $SiNO_x$ or ATO, for example $AlTiO_x$, for example having a layer thickness in a range of approximately 300 nm to approximately 1.5 µm, for example having a layer thickness in a range of approximately 500 nm to approximately 1 µm, in order to protect electrically unstable substances. Furthermore, in various embodiments, one or a plurality of antireflection layers can additionally be provided.

Figure 2:
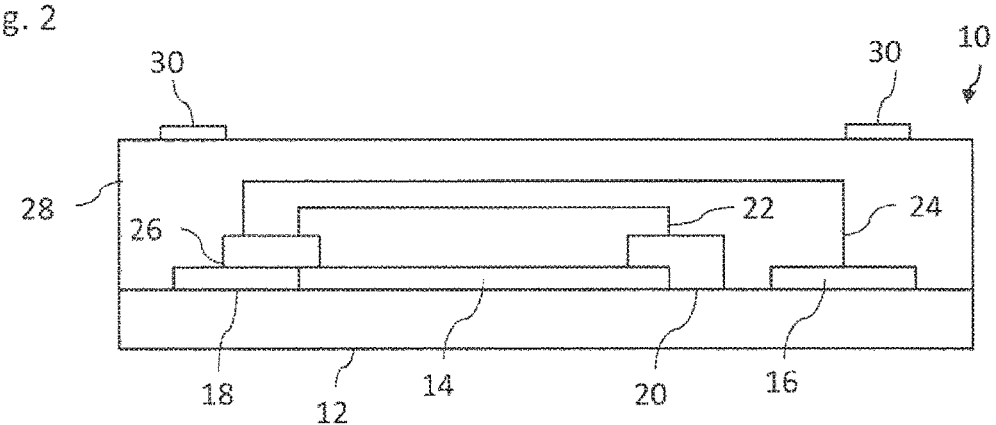
FIG. 2 shows the first component parts of the optoelectronic component in accordance with FIG. 1 in a second state during the method for producing the optoelectronic component.

FIG. 2 shows the optoelectronic component 10 in accordance with FIG. 1 in a second state during the method for producing the optoelectronic component 10. In this state, a frame structure 30 is formed on the encapsulation layer 28. The frame structure 30 is formed in a laterally structured manner on the encapsulation layer 28, only two side elements of the frame structure 30 being shown in FIG. 2. In plan view, the frame structure 30 can be formed in a frame-shaped fashion, however, wherein in plan view said frame structure can form a frame around the functional layer structure 22. As an alternative thereto, the frame structure 30 can be formed on or applied to the encapsulation layer 28 in a manner closed in a planar manner, for example.

The frame structure 30 includes a first metallic material. The first metallic material may include for example aluminum, zinc, chromium, copper, molybdenum, silver, gold, nickel, gallium, indium and/or tin. The frame structure 30 can have for example a thickness in the range of 10 nm to 100 µm, for example of 15 nm to 50 µm, for example of 20 nm to 25 µm. The frame structure 30 may include for example a plurality of partial layers formed one above another. The frame structure 30 can for example firstly be applied to the encapsulation layer 28 in a manner closed in a planar manner and can subsequently be structured, for example with the aid of a masking and removal process, or the frame structure 30 can be applied in a directly structured manner, for example with the aid of a printing method. The frame structure 30 can be present for example in solid or liquid form, for example in viscous form. By way of example, the frame structure 30 can be formed by a liquid adhesion alloy or starting alloy.

Figure 3:
FIG. 3 shows second component parts of the optoelectronic component in a first state during the method for producing the optoelectronic component.

FIG. 3 shows further component parts of the optoelectronic component 10 in a first state during the method for producing the optoelectronic component 10. In particular, FIG. 3 shows a covering body 36, on which an adhesion layer 34 is formed. The covering body 36 may for example include glass and/or be formed by a laminating glass. The adhesion layer 34 includes a second metallic material. The second metallic material can be the same metallic material as the first metallic material. As an alternative thereto, however, the second metallic material can also be a different metallic material. As an alternative thereto, the covering body 36 can also be formed as a protective layer or film. The adhesion layer 34 can be formed in a manner closed in a planar manner on the covering body 36 or in a structured manner in a lateral direction on the covering body 36. If the adhesion layer 34 is formed in a structured manner, then it can for example firstly be applied to the covering body 36 in a manner closed in a planar manner and can subsequently be structured, for example with the aid of a masking and/or removal process, or the adhesion layer 34 can be applied in a directly structured manner, for example with the aid of a printing method. The structured adhesion layer 34 can be delimited by an anti-adhesion layer. As an alternative thereto, the adhesion layer 34 can be formed by the covering body 36. In other words, the covering body 36 and the adhesion layer 34 can optionally be formed integrally.

Figure 4:
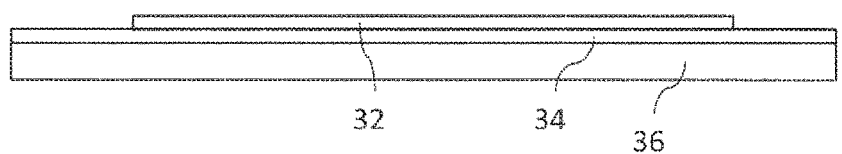
FIG. 4 shows the second component parts of the optoelectronic component in accordance with FIG. 3 in a second state during the method for producing the optoelectronic component.

FIG. 4 shows the further component parts of the optoelectronic component 10 from FIG. 3 in a second state during the method for producing the optoelectronic component 10. In particular, FIG. 4 shows the covering body 36 with the adhesion layer 34. A liquid first alloy 32, that is to say in a liquid state of matter, is applied on the adhesion layer 34. The first alloy 32 is applied to the adhesion layer 34 only in a partial region. The partial region can correspond for example to the frame formed by the frame structure 30 shown in FIG. 6, or to a region encompassed by the frame. The application of the liquid first alloy 32 only in the partial region can be controlled for example by way of the amount of the first alloy 32 and/or with the aid of the anti-adhesion layers (not illustrated) which delimit for example the second adhesion layer 34 in a frame-shaped fashion in a manner corresponding to the frame structure 30. Such an anti-adhesion layer may include for example titanium oxide, gallium oxide, tungsten oxide, zirconium oxide and/or aluminum oxide.

The first alloy 32 has a low melting point. By way of example, the first alloy 32 is in its liquid state of matter at temperatures in a range of between −20 and 100° C., for example between 0° and 80° C., for example between 20° and 30° C. By way of example, the first alloy 32 is liquid at room temperature. In other words, the first alloy 32 can be applied to the adhesion layer 34 in the liquid state at room temperature. The first alloy 32 can be applied for example by means of printing, dispensing and/or as a solution.

The molecules of the first alloy 32, where they are in contact with the molecules and/or atoms of the adhesion layer 34, enter into compounds, for example chemical compounds, with the corresponding atoms and/or molecules. A second alloy 33 forms as a result, the melting point of which is significantly higher than that of the first alloy 32. In particular, the materials of the first alloy 32 and of the adhesion layer 34 and the process parameters such as, for example, the processing temperature and the air pressure during processing are chosen such that the melting point of the first alloy 32 is below the process temperature and the melting point of the second alloy 33 is above the process temperature. This has the effect that the second alloy 33 solidifies during its formation or shortly thereafter and fixedly bonds to the adhesion layer 34. The second alloy 33 is applied to the adhesion layer 34 with a thickness such that only one part of the first alloy 32 reacts with the material of the adhesion layer 34 and another part of the first alloy at least initially remains liquid.

The first alloy 32 may include for example gallium, indium, tin, copper, molybdenum, silver and/or bismuth. The first alloy 32 may include for example GaInSn, for example between 60% and 70% gallium, between 20% and 30% indium and between 10% and 20% tin. The first alloy 32 may include for example 68% gallium, 22% indium and 10% tin, wherein the first alloy 32 then has its melting point at approximately −19.5° C. and wherein the first alloy then wets glass, for example a covering body 36. As an alternative thereto, the first alloy 32 may include for example 62% gallium, 22% indium and 16% tin, wherein the first alloy 32 then has its melting point at approximately 10.7° C. and wherein the first alloy 32 can then be referred to as Field's metal. The exact melting point can be set depending on the portion of tin in the first alloy. As an alternative thereto, the first alloy 32 may include InBiSn, for example 51% indium, 33% bismuth and 16% tin, wherein the first alloy then has its melting point at approximately 62° C. and wherein the first alloy then wets glass, for example the covering body, and wherein the first alloy 32 can then be processed on a hot plate. Correspondingly, the second alloy 33 may include for example GaInSn having a significantly higher tin concentration or GaInSnAl. The first alloy 32 can be formed with a thickness of for example 10 nm to 50 μm, for example of 20 nm to 25 μm.

Figure 5:
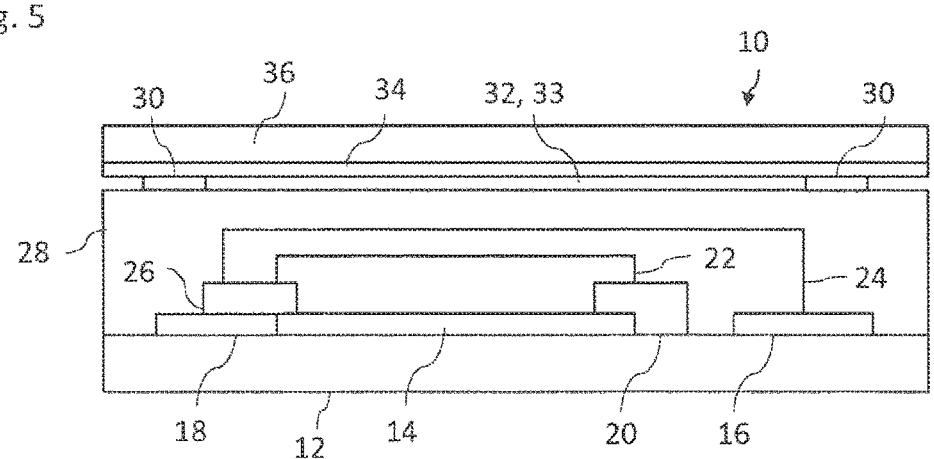
FIG. 5 shows the optoelectronic component in accordance with FIGS. 1 to 4.

FIG. 5 shows the component parts of the optoelectronic component 10 in accordance with FIGS. 1 to 4, wherein the covering body 36 with the adhesion layer 34 and the first alloy 32 and the second alloy 33 is applied to the frame structure 30. As an alternative or in addition to applying the first alloy 32 to the adhesion layer 34, the first alloy can also be applied to the frame structure 30. In this context, the anti-adhesion layer can optionally be formed alongside the frame structure 30, for example in order to precisely predefine where the first alloy 32 is intended to be arranged, and where not.

The first alloy 32 forms the second alloy 33 in a chemical reaction with the metallic materials of the frame structure 30 and the second adhesion layer 34, which second alloy solidifies and thus fixedly couples the covering body 36 to the encapsulation layer 28. Furthermore, the second alloy 33 seals the region above the functional layer structure 22 in a lateral direction. The first alloy 32 and the adhesion layers 30, 34 can be formed in such a way that the first alloy reacts completely to form the second alloy 33. However, the first alloy 32 and/or the adhesion layers 30, 34 can alternatively also be formed such that the first alloy 32 reacts only partly to form the second alloy 33 and that the first alloy 32 is present in a liquid state in one or a plurality of partial regions even after the completion of the optoelectronic component 10. By way of example, in the completed optoelectronic component 10, the first alloy 32 above the functional layer structure 22 can be present in a liquid state. This can contribute to reducing internal stresses, for example on account of thermal and/or mechanical loading, and preventing damage to the optoelectronic component 10. Furthermore, this can contribute to reducing or preventing damage to the optoelectronic component 10 if particles penetrate into the layer construction during the method. The liquid first alloy 32 can then serve as a buffer, for example. Furthermore, the liquid first alloy 32, in the case of cracks and/or holes in the encapsulation layer 28, can penetrate into the corresponding cracks and/or holes and close them.

Figure 6:
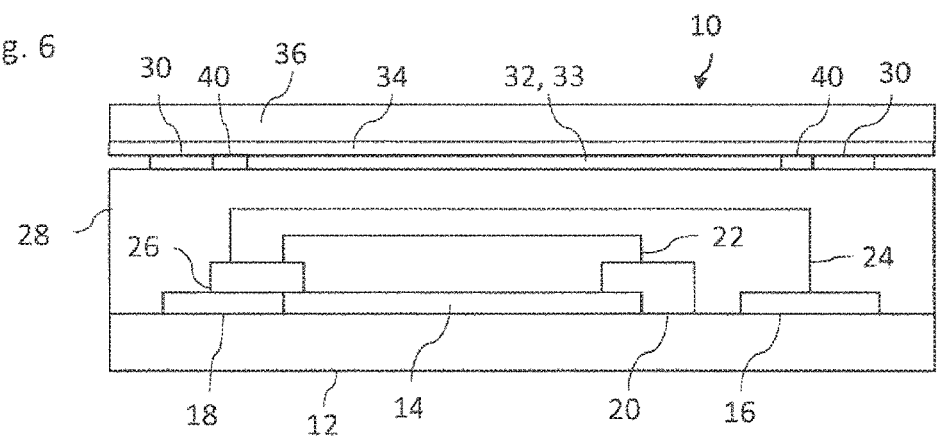
FIG. 6 shows one embodiment of an optoelectronic component.

FIG. 6 shows an optoelectronic component 10, which can for example largely correspond to the optoelectronic component 10 shown in FIG. 5. The optoelectronic component 10 includes a nonreactive material 40 at least in sections adjoining the frame structure 30. The nonreactive material 40 in particular does not react chemically with the first alloy 32. In other words, no second alloy 33 forms in contact regions in which the first alloy 32 touches the nonreactive material 40. The nonreactive material 40 can be arranged alongside the frame structure 30 for example in such a way that between the sections of the nonreactive material 40 the first alloy 32 can still react with the metallic material of the frame structure 30, but the overall reaction is restricted, whereby it is possible to prevent the entire first alloy 32 from reacting to form the second alloy 33. As a result, in a targeted manner it is possible to provide regions in which the first alloy 32 is present in a liquid state even after the completion of the optoelectronic component 10.

The nonreactive material may include for example nickel, aluminum oxide, titanium oxide, zirconium oxide and/or zinc oxide. The nonreactive material can be applied for example by means of dispensing, printing from emulsion and/or solution and/or by means of sputtering. The nonreactive material 40 can be chosen in such a way that it merely does not react with the first alloy 32 or that the first alloy 32 does not even wet the nonreactive material 40. As an alternative or in addition to the nonreactive material 40, it is possible to provide regions which are free of any material and merely have air or vacuum. Such regions can be provided for example with the aid of the anti-adhesion layers that cannot be wetted by the first alloy 32. An undesired further reaction of the first alloy 32 can be restricted and/or prevented with the aid of these free regions.

Figure 7:
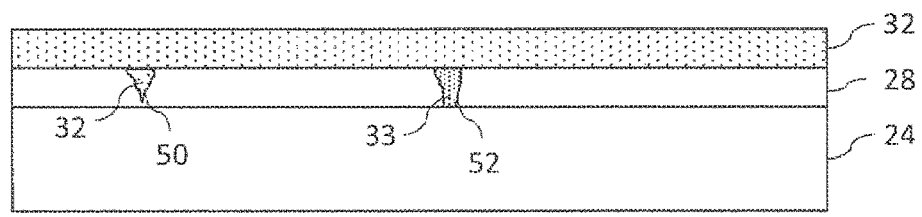
FIG. 7 shows a detail view of one embodiment of an optoelectronic component.

FIG. 7 shows a detail view of the second electrode layer 24, the encapsulation layer 28 and the first alloy 32. Defects, in particular a crack 50 and a hole 52, are formed in the encapsulation layer 28. The crack 50 does not extend as far as the second electrode layer 24. The hole 52 extends as far as the second electrode layer 24. As an alternative thereto, the crack 50 can extend as far as the second electrode layer 24 and/or the hole 52 may not extend as far as the second electrode layer 24. The crack 50 and/or the hole 52 may arise during production, during storage and/or during operation of the optoelectronic component 10.

The liquid first alloy 32 flows into the crack 50 and the hole 52 and thus closes the crack 50 and the hole 52. The second electrode layer 24 may include a metallic material that can correspond for example to one of the metallic materials mentioned above. The metallic material of the second electrode layer 24 can be chosen in such a way that the first alloy 32, which comes into direct physical contact with the second electrode layer 24 in the hole 52, reacts chemically with the metallic material and then forms an alloy, for example the second alloy 33, which then solidifies and fixedly and/or tightly closes the hole 52. In this way, the optoelectronic component 10 is able itself to repair and/or heal defects that occur.

Figure 8:
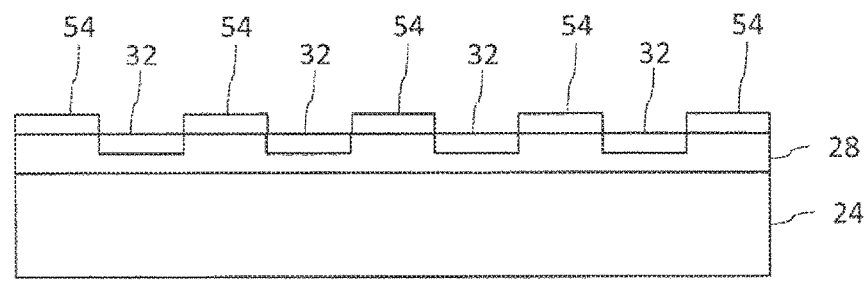
FIG. 8 shows a detail view of one embodiment of an optoelectronic component.

FIG. 8 shows a detail view of the second electrode layer 24, the encapsulation layer 28 and the first alloy 32. An anti-adhesion layer 54 is formed above the encapsulation layer 28. The anti-adhesion layer 54 can be formed for example in accordance with one of the anti-adhesion layers explained above. The encapsulation layer 28 can have a plurality of cutouts in which the first alloy 32 is arranged. The first alloy 32 does not wet the anti-adhesion layers 54 and is delimited by the latter. The cutouts can serve as particle catchers. This makes it possible to employ standard encapsulation methods such as, for example, cavity encapsulation, frit encapsulation, or a laminate (adhesive bonding).

The invention is not restricted to the embodiments indicated. By way of example, the optoelectronic component 10 may include fewer or more layers. By way of example, the optoelectronic component 10 may include a mirror layer, an antireflection layer and/or a coupling-out layer. Furthermore, the embodiments can be combined with one another. By way of example, the optoelectronic component 10 shown in FIG. 6 can be produced with the aid of the methods shown with reference to FIGS. 1 to 5. Furthermore, the same alloys and metallic materials can always be used within a single one of the optoelectronic components 10. As an alternative thereto, correspondingly different alloys and/or different metallic materials can be used at different locations within one of the optoelectronic components 10, wherein, if appropriate, different melting points of the alloys can advantageously be utilized in this case.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, the method comprising:
    forming an optoelectronic layer structure comprising a functional layer structure above a carrier,
    forming a frame structure comprising a first metallic material on the optoelectronic layer structure in such a way that a region above the functional layer structure is free of the frame structure and that the frame structure surrounds the region,
    forming an adhesion layer comprising a second metallic material above a covering body,
    applying a liquid first alloy to the optoelectronic layer structure and/or to the adhesion layer of the covering body in the region,
    coupling the covering body to the optoelectronic layer structure in such a way that the adhesion layer is coupled to the frame structure and the liquid first alloy is in direct physical contact with the adhesion layer and the frame structure, and
    reacting at least part of the first alloy chemically with the metallic materials of the frame structure and the adhesion layer, as a result of which at least one second alloy is formed which solidifies and thus fixedly connects the covering body to the optoelectronic layer structure.

2. The method as claimed in claim 1, wherein the melting point of the first alloy is in a range of between −20° C. and 100° C.

3. The method as claimed in claim 2, wherein the first alloy is liquid at room temperature.

4. The method as claimed in claim 1, wherein the first alloy comprises gallium, indium, tin, copper, molybdenum, silver and/or bismuth.

5. The method as claimed in claim 1, wherein the first and/or second metallic material comprises aluminum, zinc, chromium, copper, molybdenum, silver, gold, nickel, gallium, indium and/or tin.

6. The method as claimed in claim 1, wherein the optoelectronic layer structure comprises an encapsulation layer, and wherein the frame structure is formed on the encapsulation layer.

7. The method as claimed in claim 1, wherein a first anti-adhesion layer is formed laterally adjacently to the frame structure at least in sections, the material of which first anti-adhesion layer does not react chemically with the first alloy and/or which first anti-adhesion layer is not wetted by the first alloy.

8. The method as claimed in claim 1, wherein a second anti-adhesion layer is formed laterally adjacently to the adhesion layer above the covering body, the material of which second anti-adhesion layer does not react chemically with the first alloy and/or which first anti-adhesion layer is not wetted by the first alloy.

9. An optoelectronic component, comprising:
    a carrier,
    a optoelectronic layer structure comprising a functional layer structure above the carrier,
    a frame structure comprising a first metallic material above the optoelectronic layer structure, wherein a region above the functional layer structure is free of the frame structure and the frame structure surrounds the region,
    a covering body with an adhesion layer, which comprises a second metallic material and which is coupled to the frame structure,
    a liquid first alloy arranged in the region on the optoelectronic layer structure, and a second alloy, which emerges from a chemical reaction of the first alloy with the metallic materials of the frame structure and the adhesion layer, wherein the second alloy is rigid and fixedly connects the covering body to the optoelectronic layer structure.

10. The optoelectronic component as claimed in claim 9, wherein the melting point of the first alloy is in a range of between −20° C. and 100° C.

11. The optoelectronic component as claimed in claim 10, wherein the first alloy is liquid at room temperature.

12. The optoelectronic component as claimed in claim 9, wherein the first alloy comprises gallium, indium, tin and/or bismuth.

13. The optoelectronic component as claimed in claim 9, wherein the first and/or second metallic material comprises aluminum and/or zinc.

14. The optoelectronic component as claimed in claim 9, wherein the optoelectronic layer structure comprises an encapsulation layer, and wherein the frame structure is formed on the encapsulation layer.

* * * * *